US009287354B2

(12) United States Patent
Hirler

(10) Patent No.: US 9,287,354 B2
(45) Date of Patent: Mar. 15, 2016

(54) SEMICONDUCTOR COMPONENT AND METHOD FOR PRODUCING IT

(71) Applicant: Infineon Technologies Austria AG, Villach (AT)

(72) Inventor: Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 170 days.

(21) Appl. No.: 13/917,034

(22) Filed: Jun. 13, 2013

(65) Prior Publication Data

US 2013/0277710 A1 Oct. 24, 2013

Related U.S. Application Data

(63) Continuation of application No. 12/175,848, filed on Jul. 18, 2008, now Pat. No. 8,541,839.

(30) Foreign Application Priority Data

Jul. 18, 2007 (DE) .......................... 10 2007 033 839

(51) Int. Cl.
*H01L 29/749* (2006.01)
*H01L 29/745* (2006.01)
(Continued)

(52) U.S. Cl.
CPC .......... *H01L 29/0611* (2013.01); *H01L 21/765* (2013.01); *H01L 29/407* (2013.01); *H01L 29/7802* (2013.01); *H01L 29/7816* (2013.01); H01L 29/0619 (2013.01); H01L 29/0696 (2013.01); H01L 29/0878 (2013.01);
(Continued)

(58) Field of Classification Search
CPC ................. H01L 2924/00; H01L 2924/13091; H01L 29/1095; H01L 29/0696
USPC .................................... 257/341, 342; 438/588
See application file for complete search history.

(56) References Cited

U.S. PATENT DOCUMENTS 5,233,215 A * 8/1993 Baliga ............................ 257/490
5,554,862 A * 9/1996 Omura et al. .................. 257/137
(Continued)

FOREIGN PATENT DOCUMENTS

DE 10214151 10/2003
DE 10339488 4/2005

OTHER PUBLICATIONS

Non-Final Office Action mailed Dec. 22, 2010 in U.S. Appl. No. 12/175,848.

*Primary Examiner* — Mary Wilczewski
*Assistant Examiner* — Tsz Chiu
(74) *Attorney, Agent, or Firm* — Dicke, Billig & Czaja, PLLC

(57) ABSTRACT

A semiconductor component having differently structured cell regions, and a method for producing it. For this purpose, the semiconductor component includes a semiconductor body. A first electrode on the top side of the semiconductor body is electrically connected to a first zone near the surface of the semiconductor body. A second electrode is electrically connected to a second zone of the semiconductor body. Furthermore, the semiconductor body has a drift path region, which is arranged in the semiconductor body between the first electrode and the second electrode. A cell region of the semiconductor component is subdivided into a main cell region and an auxiliary cell region, wherein the breakdown voltage of the auxiliary cells is greater than the breakdown voltage of the main cells.

16 Claims, 5 Drawing Sheets

(51) Int. Cl.
*H01L 29/66* (2006.01)
*H01L 29/06* (2006.01)
*H01L 29/40* (2006.01)
*H01L 29/78* (2006.01)
*H01L 21/765* (2006.01)
*H01L 29/08* (2006.01)
*H01L 29/417* (2006.01)
*H01L 29/423* (2006.01)

(52) U.S. Cl.
CPC ..... *H01L29/41758* (2013.01); *H01L 29/41766* (2013.01); *H01L 29/4238* (2013.01)

(56) References Cited

U.S. PATENT DOCUMENTS

| | | | |
|---|---|---|---|
| 6,184,555 B1 * | 2/2001 | Tihanyi et al. | 257/342 |
| 6,674,126 B2 | 1/2004 | Iwamoto et al. | |
| 7,541,643 B2 * | 6/2009 | Ono et al. | 257/341 |
| 2002/0175351 A1 * | 11/2002 | Baliga | 257/242 |
| 2003/0132450 A1 * | 7/2003 | Minato et al. | 257/110 |
| 2004/0099905 A1 * | 5/2004 | Baliga | 257/328 |

\* cited by examiner

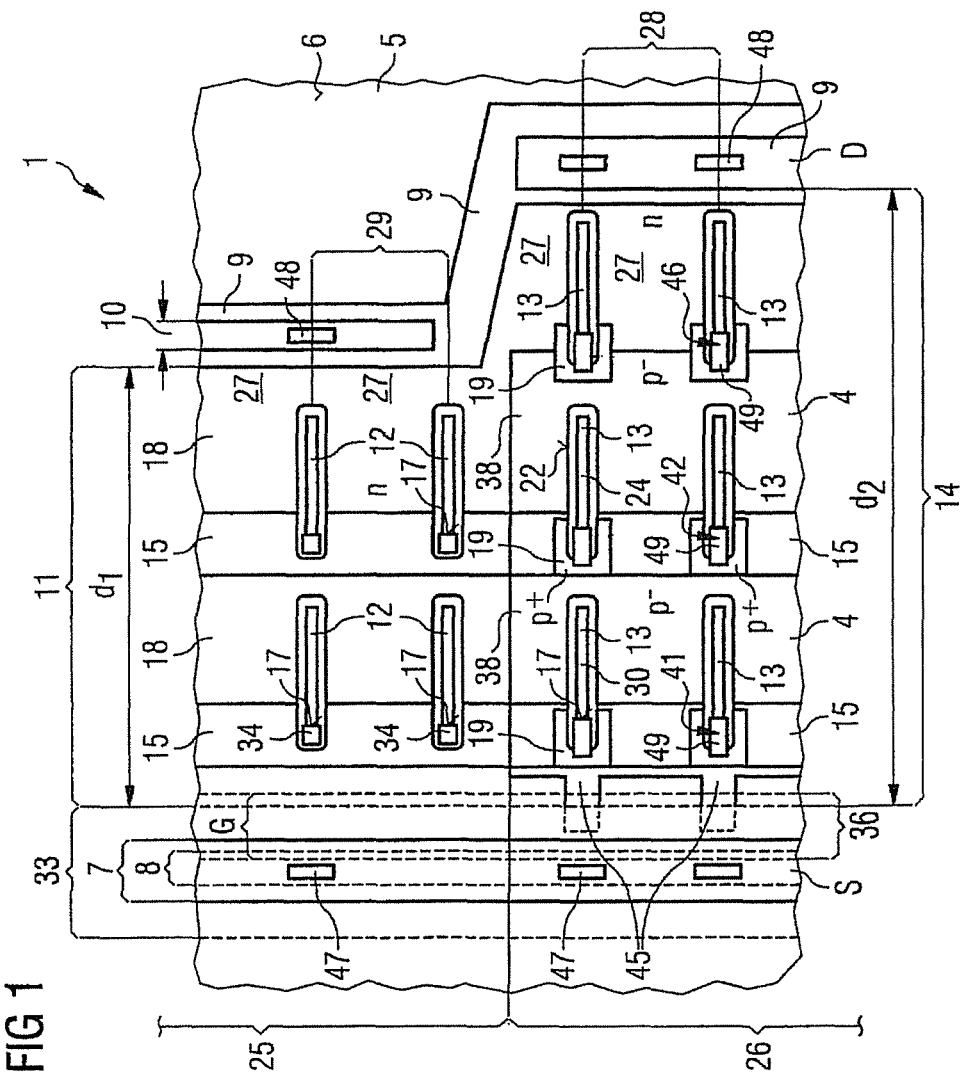

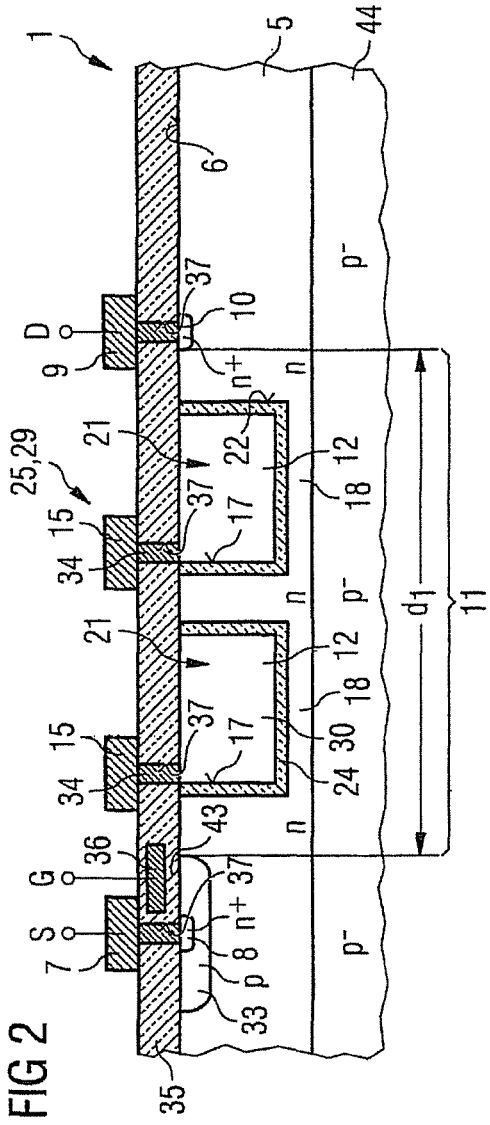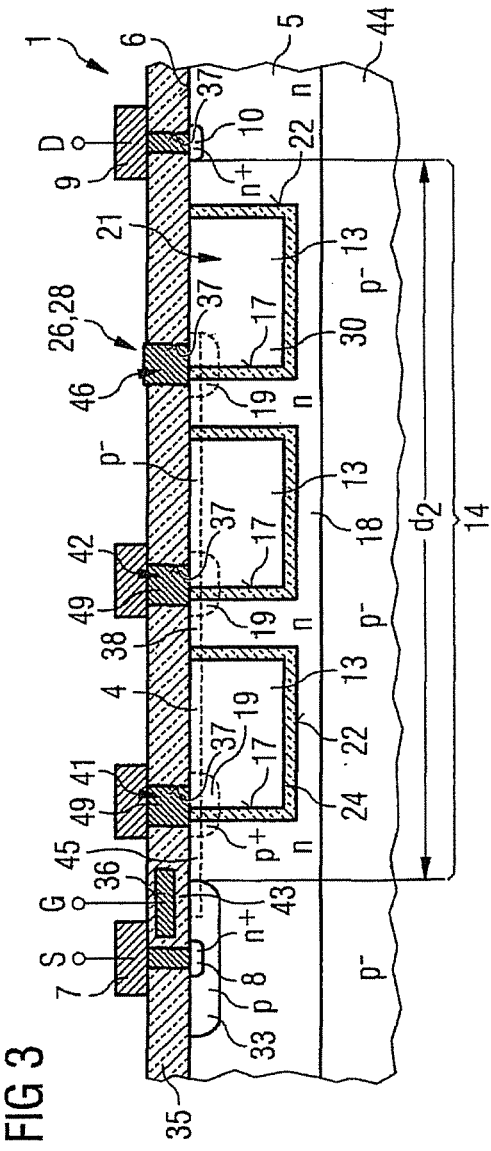

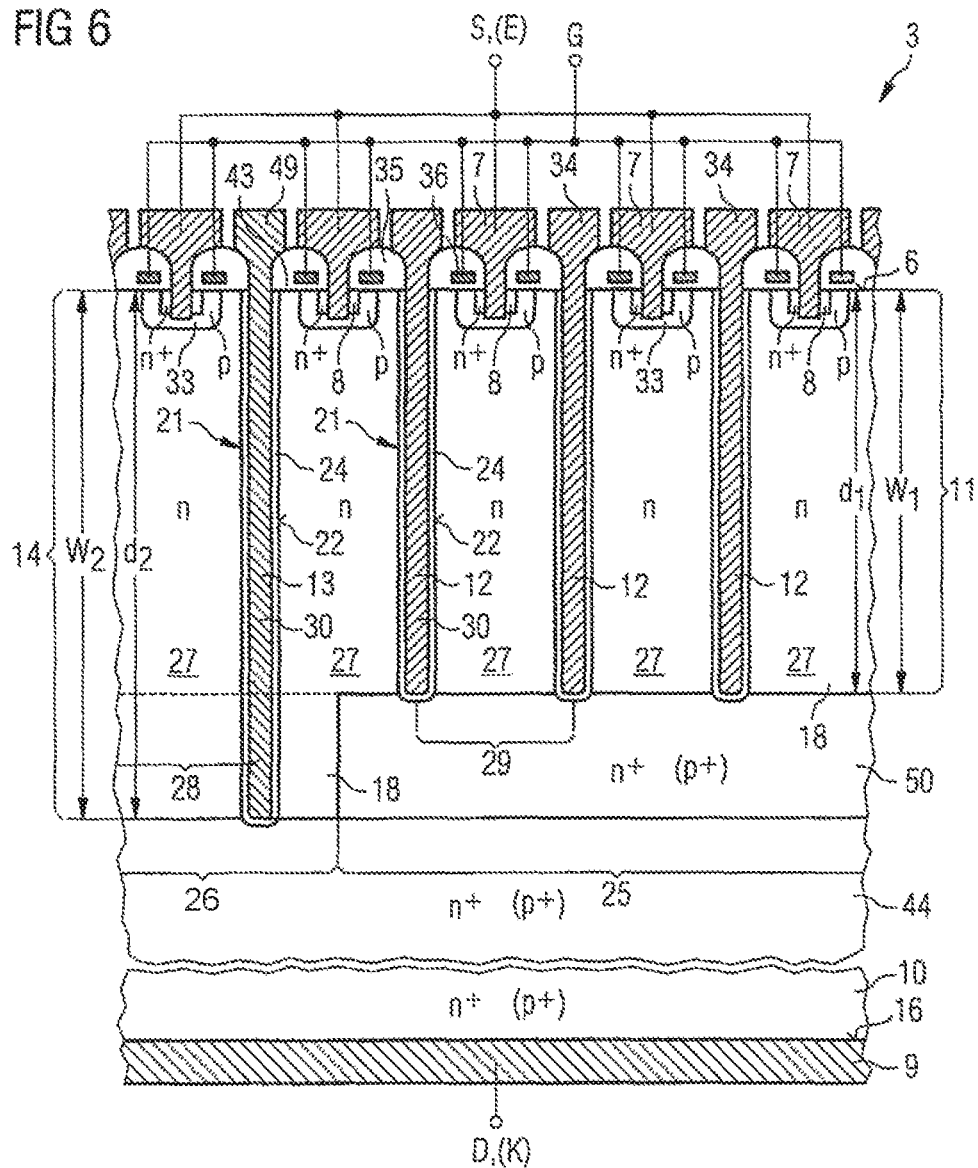

US 9,287,354 B2

SEMICONDUCTOR COMPONENT AND METHOD FOR PRODUCING IT

CROSS-REFERENCE TO RELATED APPLICATIONS

This Utility patent application is a continuation of U.S. patent application Ser. No. 12/175,848, filed Jul. 18, 2008, which claims priority to German Patent Application No. DE 10 2007 033 839.4, filed on Jul. 18, 2007, which are both incorporated herein by reference.

BACKGROUND

This disclosure relates to a semiconductor component having differently structured cell regions, and a method for producing it. Differently structured cell regions are used in semiconductor components having a drift path region between a first electrode and a second electrode. In this case, the different cell structure depends on whether the drift path is oriented laterally between the two electrodes arranged on a surface of a semiconductor body or whether the drift path is oriented vertically in a semiconductor body between an electrode on the top side of the semiconductor body and an electrode on the rear side of the semiconductor body. In general, however, the orientation of the drift path and the current flow direction are independent of the arrangement of the electrodes.

Furthermore, different cell regions are realized by subdividing the drift path into drift zones and field plate regions. These semiconductor components having differently structured cell regions nevertheless exhibit a uniform drift path length adapted to the reverse voltage of the semiconductor component. The drift path length is of consistent length in all the cell regions in order to ensure that the reverse voltage provided for the semiconductor component is achieved in the entire drift path region.

If a semiconductor component having field plates which project into the drift path and draw their potential from the drift path via a diffusion region is operated in the avalanche case, then the avalanche-generated charge carriers alter the charge and thus the voltage on the field plates. Depending on the structure and the current density, this can lead to an increase in the breakdown voltage or a decrease in the breakdown voltage. A decrease in the breakdown voltage as the current density increases is referred to as the "snapback effect" and is critical at high current densities since this instability can lead to splitting and destruction of the semiconductor component.

For these and other reasons, there is a need for the present invention.

SUMMARY

One embodiment of the invention provides a semiconductor component having differently structured cell regions, and a method for producing it. In this respect, the semiconductor component includes a semiconductor body. A first electrode on a surface of the semiconductor body is electrically connected to a first zone near the surface of the semiconductor body. A second electrode is electrically connected to a second zone of the semiconductor body. The semiconductor body has a drift path region, which is arranged in the semiconductor body between the first electrode and the second electrode. A cell region of the semiconductor component is subdivided into a main cell region and an auxiliary cell region, wherein the breakdown voltage of the auxiliary cells is greater than the breakdown voltage of the main cells.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a schematic plan view of a semiconductor component in accordance with one embodiment of the invention.

FIG. 2 illustrates a schematic cross section through the semiconductor component in accordance with FIG. 1 in a main cell region.

FIG. 3 illustrates a schematic cross section through the semiconductor component in accordance with FIG. 1 in an auxiliary cell region.

FIG. 6 illustrates a schematic cross section through a semiconductor component in accordance with a further embodiment of the invention.

DETAILED DESCRIPTION

Figure 4:
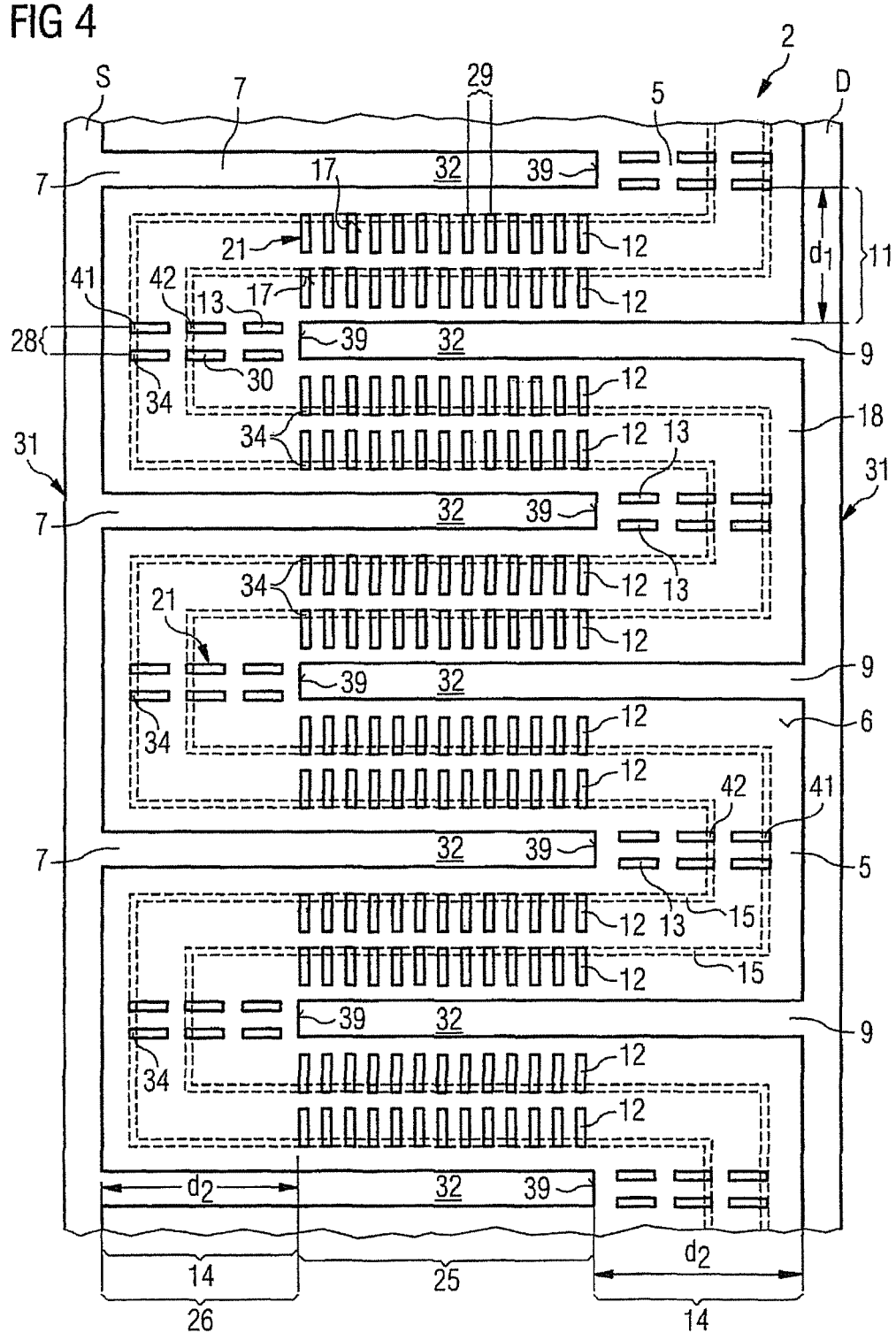
FIG. 4 illustrates a schematic plan view of a semiconductor component in accordance with a further embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 illustrates a schematic plan view of a semiconductor component 1 in accordance with one embodiment of the invention. The semiconductor component 1 is arranged on and in a semiconductor body 5. Here this semiconductor body 5 is composed of monocrystalline silicon and has, on its top side, a first electrode 7 in the form of a metallic strip that is electrically connected via strip-type or insular contact windows 47 to a strip-type or insular zone 8 near the surface. Furthermore, the top side 6 of the semiconductor body 5 has a second electrode 9, which is formed in strip-type fashion and is electrically connected via contact windows 48 to a region 10 near the surface of the semiconductor body 5.

While the second electrode 9 makes contact with the drift path material of the drift path region 18 directly via the contact windows 48 and the highly doped zone 10 near the surface, the region 8 near the surface of the first electrode 7 is surrounded by a strip-type body zone 33 doped complementarily to the drift path region 18, wherein the source electrode normally makes contact with the body zones as well. A drift path 11 having a drift path length d1 and a main cell region 25 having main cells 29 extends between the body zone 33 and the second zone 10 near the surface. Moreover, a drift path 14 having a drift path length d2, in which an auxiliary cell region 26 having auxiliary cells 28 is arranged, extends between the body zone 33 and the zone 10 near the surface. In this case, the drift path length d1 of the main cell region 25 is less than the drift path length d2 of the auxiliary cell region 26. In this case, the auxiliary cell region can be active, that is to say equipped with source zones and gate electrodes, or alternatively only have body regions with which contact is made by the source electrode.

This ensures that in the avalanche case of the main cell region 25, the auxiliary cell region 26 does not undergo transition to the avalanche state since, as a result of the larger drift path length d2, the field strength can be made lower in the auxiliary cell region 26 than in the main cell region 25 and an avalanche state cannot occur in the auxiliary cell region 26. By virtue of the thus differently structured cell regions 25 and 26 in a first type of cells, namely the main cells 29 in the main cell region 25, which form the main transistor. The main cells 29 are constructed from field plates 12 which are oriented in a lateral direction and project vertically into the drift path 11, and which are not connected to the adjacent drift path 11. Rather, they are surrounded by an insulation layer 24 and have a field plate contact 34, which is electrically connected to a strip-type interconnect 15 that does not make contact with the drift path material. In the avalanche operating mode, the main cells 29 carry the whole or at least the substantial portion of the current within their drift zones 27. In the on-state case, too, the totality of the main cells 29 carries the substantial portion of the current.

The auxiliary cells 28, which are likewise oriented laterally and have field plates 13 projecting into the drift path material, provide the voltages or potentials for the field plates 12 of the main cells 29. The auxiliary cell region 26 has a breakdown voltage higher than the breakdown voltage of the main cell region 25 and therefore does not undergo transition to the avalanche case even up to very high current densities. For this purpose, the drift path 14 of the auxiliary cells 28 is designed to be longer by virtue of more field plates 13 being arranged in staggered fashion one behind another in the auxiliary cell region 26 than in the main cell region 25.

Whereas in this embodiment a plurality of field plates 12 and 13 are respectively arranged one behind another both in the main cell region 25 and in the auxiliary cell region 26, there is also the possibility of arranging individual field plates in each of the regions, wherein these field plates 13 are then designed to be longer in the auxiliary cell region 26 than in the main cell region 26. As already mentioned above, this reduces the field strength in the auxiliary cell region 26 and has the effect that the field plate voltages are independent of avalanche-generated charge carriers. As a result, the reverse voltage of the main cells 29 becomes independent of charging effects of the field plates 12 due to avalanche-generated charge carriers.

Furthermore, it is possible for the oxide thickness profile along the trench walls of the trench structures for the field plates in the main cell region 25 to be configured differently than the oxide thickness profiles of the trench walls of the trench structures of the field plates in the auxiliary cell region 26. Thus, by way of example, the oxide layer of the trench structure in the main cell region 25 can have a uniform thickness, while the oxide layer thickness of the trench walls of the trench structures of the field plates in the auxiliary cell region 26 is formed in wedge-shaped fashion.

While the field plates 12 in the main cell region 25 have no contact with the surrounding drift path material, ends 17 of the field plates 13 in the auxiliary cell region 26 are electrically coupled to the drift path material of the drift path 14 in the coupling positions 41, 42 and 46 via floating zones 19 that are conductive complementarily to the drift path, and associated field plate contacts 49.

Furthermore, the auxiliary cells 28, like the main cells 29, are equipped with an active channel, such that they can contribute to the on resistance Ron×area A. The on resistivity, Ron×area A, of the auxiliary cells 28 is typically 10 to 30% higher than that of the main cells 29. The auxiliary cells 28, apart from the field plate contacts 49 of the field plates 13 to the drift zone 27, can be designed identically to the main cells 29 for lateral semiconductor components, as is illustrated in FIG. 1.

However, the auxiliary cell region 26 can also structurally differ further from the main cell region 25 by the provision of e.g., p-conducting channels for voltage limiting between the field plates 13 or discharge structures such as a weakly doped p--conducting discharge layer 38 near the surface. As illustrated in FIG. 1 in conjunction with FIG. 2, connecting webs 45 to the body zone 33 are provided, which ensure that the floating zones 19 in the coupling positions 41, 42 and 46 are discharged toward the body zone. Alongside a discharge layer 38 of this type, it is also possible to provide separate regions having discharge cells as a third type of cells in a semiconductor component of this type. The different embodiment of the main cell region 25 and of the auxiliary cell region 26 is illustrated by the schematic cross sections illustrated in the following figures.

FIG. 2 illustrates a schematic cross section through the semiconductor component 1 in accordance with FIG. 1 in a main cell region 25. The main cell region 25 forms a lateral MOS field effect transistor having a source electrode S as first electrode 7 and a drain electrode D as second electrode 9 on an insulation layer 35 on the top side 6 of the semiconductor body 5. Arranged in the insulation layer 35 are windows 37 via which through contacts make contact with the corresponding zones 8 and 10 near the surface and the electrodes 7 and 9, respectively, arranged on the insulation layer 35.

A control electrode 36 in the form of a gate electrode G is arranged within the insulation layer 35 and, via a gate oxide 43, controls an n-conducting channel through the body zone 33 for switching on a lateral MOS field effect transistor in the main cell region 25. This cross section additionally illustrates that the drift path 11 reaches in the semiconductor body 5 as far as a p--conducting substrate 44, wherein in this embodiment of the invention two field plates 12 with an electrically conductive material 30 that are arranged one behind another project vertically into the drift path material.

In this case, the electrically conductive material 30, which can include a highly doped polysilicon or can be composed of metal, is arranged in the trench structure 21 and electrically insulated from the drift path material by an insulating layer 24, which covers the trench walls 22. In the main cell region 25, none of the field plates 12 is connected directly to the surrounding drift path material, but rather connected via a field plate contact 34, which extends through the insulation layer 35, to a strip-type interconnect 15 arranged on the insulation layer 35, which interconnect produces the electrical connection to the field plates 13 in the auxiliary cell region 26.

FIG. 3 illustrates a schematic cross section through the semiconductor component 1 in accordance with FIG. 1 in an auxiliary cell region 26, wherein in this embodiment one field plate more is arranged in staggered fashion in the drift path 14, such that the drift path length d2 is greater than the drift path length d1 of the main cell region 25. Alongside the coupling structure via a p+-conducting floating zone 19 at ends 17 of the field plates 13, a p--conducting discharge layer 38 is illustrated here by a dashed line, which discharge layer connects the highly doped floating zones 19 to the base zone 33.

In this case, the connecting layer 38 merges into connecting webs 45 toward the body zone 33 in order not to impair the completely satisfactory functionality of the control electrode 36 via the gate oxide 43. For this purpose, the control electrode 36 can also be correspondingly interrupted at the locations at which the connecting webs 45 make contact with the body zone 33. In order to fulfill the coupling function at the coupling positions 41, 42 and 46, the field plate contacts 49 are made wider in the auxiliary cell region 26 than in the main cell region 25. This ensures that the field plates 13 are electrically connected to the corresponding floating zones 19.

Instead of the discharge layer 38 illustrated in FIG. 3, it is also possible to discharge the auxiliary cells 28 in the auxiliary cell region 26 by p-channel MOS transistors. It is also possible to introduce at the coupling positions 41, 42 and 46 a second highly doped zone, which has the same conduction type as the drift path 14, and thus to connect the floating zone 19 via this n+-conducting second zone to the drift path material in the direction toward the first electrode 7. In this case, a punch-through effect can be utilized, which ensures that the discharge of the floating zones 19 of the field plates 13 is improved.

In order that the main load of carrying current can be undertaken by the main cell region 25, the number of field plates 12 is larger in the main cell region 25 than in the auxiliary cell region 26. The drift paths 11 and 14 are weakly n-doped and arranged on a p--conducting substrate 44.

Embodiment of a method for producing a plurality of semiconductor chips for semiconductor components 1 having drift paths 11 and 14 in main cell regions 25 and auxiliary cell regions 26, respectively, wherein the length of the drift path 11 is smaller in the main cell region 25 than in the auxiliary cell region 26, is also disclosed. The first method involves patterning a semiconductor wafer composed of a monocrystalline semiconductor body 5 with semiconductor component structures in semiconductor chip positions.

In this case, the semiconductor structures can have diode, MOSFET or IGBT structures having lateral or vertical drift paths 11 and 14 for the main cell region 25 and the auxiliary cell region 26. For this purpose, dopants of a complementary conduction type are introduced at coupling positions 41 between provided ends 17 of field plates 13 and the drift path 14 in the auxiliary cell region 26 given a predetermined drift path length for floating p+-conducting zones 19. After the introduction of such floating zones 19 in the auxiliary cell region 26, vertical trench structures 21 are introduced into the drift paths 11 and 14. The trench walls 22 of the trench structures 21 are then provided with an insulating layer 24. The trench structures 21 are subsequently filled with a conductive material 30 to form field plates 12 and 13. Owing to the high temperatures budget for the oxides in the trench structures, the order is reversed in some embodiments, namely by firstly producing the trench structure with oxide and electrodes and then introducing the floating zones 19.

The diode, MOSFET or IGBT structures can then be completed. Afterwards, electrodes 7 and 9 and at least one interconnect 15 of a coupling structure are deposited selectively in the semiconductor chip positions of the semiconductor wafer, whereby the field plates 12 of the main cell region 25 are electrically coupled to the field plates 13 of the auxiliary cell region 26.

This method can be used both for lateral semiconductor component structures and for vertical semiconductor component structures. In this case, with lateral structures, for realizing a longer drift path 14 of the auxiliary cell region 26 relative to a shorter drift path 11 of the main cell region 25, the distance between the first electrode 7 and the second electrode 9 is merely increased on the top side 6 of the semiconductor body 5. With vertical structures, this is not quite as easy to carry out since, with vertical structures, although the trench structures 21 are also introduced into epitaxial layers, the drift path length d is predetermined in principle with the thickness of the epitaxial layer.

In a vertical semiconductor component, therefore, a pedestal epitaxial layer is applied in the main cell region 25, the doping of the pedestal epitaxial layer being adapted to the substrate 44 of the semiconductor wafer. With a pedestal of this type it is possible to shorten the drift path length d1 in the main cell region 25, while in the auxiliary cell region 26, in which such a highly doped pedestal is dispensed with, it is possible to provide a larger drift path length d2 for the field plates 13 arranged in trench structures 21 and the surrounding drift zones 27. Such a pedestal epitaxial layer can be produced in a simple manner by a partial region of an epitaxial layer applied to the substrate 44 being doped more highly and being adapted in terms of its doping to the substrate 44 of the semiconductor wafer. Consequently, both for lateral and for vertical component structures it is possible to realize different drift path lengths in embodiments of the invention with longer trench structures 21 for field plates 13 in auxiliary cell regions 26 than in main cell regions 25.

After the production of corresponding semiconductor wafers with semiconductor chip positions, the semiconductor wafers are separated into individual semiconductor chips and processed further to form semiconductor components. During this further processing, the semiconductor chips are applied, for example, to a component carrier with a plurality of external contacts in a plurality of semiconductor device positions. The electrodes of the semiconductor chips which are situated on the semiconductor body 5 are then connected to contact pads which are situated on the component carrier, and which are electrically connected to external contacts, via corresponding connecting elements. Finally, the components thus prepared are introduced into a semiconductor component housing with inclusion of the individual semiconductor chips and the connecting elements. Finally, the component carrier is then separated into individual semiconductor components 1 having differently structured cell regions 25 and 26.

In a further exemplary implementation of the method, a p--conducting discharge layer 38 is implanted or diffused as field plate discharge structure 4 after the introduction of the trench structures in the auxiliary cell region 26. It is also possible for an additional p+-conducting strip, arranged transversely with respect to the drift path, to be implanted or diffused as a field plate discharge structure actually before or after the introduction of the trench structures in the auxiliary cell region 26. Furthermore, n+-conducting zones can be introduced into the p+-conducting strips, which zones make contact with the drift path material toward the first electrode in the auxiliary cell region 26 as a field plate discharge structure 4. The n+-conducting zone, too, is implanted or diffused after the introduction of the trench structure 21 in some embodiments.

For doping purposes, before the introduction of these dopants, firstly a patterned masking layer can be applied to the semiconductor wafer, which layer covers the surface regions of the semiconductor body 5 which are not intended to be doped. In this case, such masks have windows via which the dopant can penetrate into the semiconductor body 5 via the top side 6. Instead of an implantation, it is also possible to deposit a precoating by a dopant with the aid of a dopant-containing layer on the windows of the patterning masking layer and then to carry out an indiffusion of the dopant from the dopant-containing layer into the semiconductor body 5. In a similar manner, for producing the trench structures 21, too, firstly a patterned masking layer is applied on the semiconductor body 5, which layer has windows in the regions in which field plates 12 and 13 are to be introduced into the drift paths 11 and 14, respectively. These trench structures 21 projecting vertically into the drift path region 18 can be introduced by anisotropic etching of drift path material. A dry reactive ion etching is used for this purpose, for example.

In order to produce an insulating layer 24 on the trench walls 22 of the trench structures 21, it is possible to carry out an isotropic thermal oxidation of drift path material. In this case, silicon dioxide arises in the case of a semiconductor material such as silicon. Instead of such a thermal oxidation of the drift path material to form an insulating layer 24, it is also possible to deposit a silicone nitride layer, a silicon oxide or a layer stack including these materials on the trench walls.

In order to fill the trench structures 21 with a conductive material 30, a highly doped polysilicon can be introduced into the trench structures 21. Moreover, in order to fill the trench structures 21 with a conductive material 30, a metal can be deposited chemically or electrodeposited in the trench structures 21. On the other hand, it is also possible to fill the trench structures with a dielectric material having a higher dielectric constant as the insulating layer on the trench walls.

In order to deposit electrodes 7 and 9 or interconnects 15 in the coupling or discharge structure on the top side of the semiconductor body on an insulation layer 35 and on contact windows, sputtering or vapor deposition or an electroless chemical or an electrolytic metal deposition is carried out, which is subsequently patterned by photolithographic technology. Such interconnects 15 of the coupling or discharge structure can also be effected by depositing highly doped polysilicon. Aluminium is used for such coupling or discharge structures in some embodiments.

FIG. 4 illustrates a schematic plan view of a semiconductor component 2 in accordance with a further embodiment of the invention. In the case of this semiconductor component 2, the first electrode 7 and the second electrode 9 are formed in comblike fashion and intermesh with their webs 32. Main cell regions 25 with main cells 29 are arranged in each case where the webs 32 of the comb structure are opposite one another. Auxiliary cell regions 26 with auxiliary cells 28 are arranged at the tips 39 of the fingerlike webs 32 of the intermeshing comb structures 31. In this case, the auxiliary cell region 26, in the drift path 14, has a larger drift path length d2 than the drift path 11 having its drift path length d1 in the main cell region 25.

The field plates 12 which are not electrically connected to the drift path material in the main cell region 25 are coupled via the interconnects 15 to field plates 13 of the auxiliary cell region 26, the field plates 13 of which are protected against avalanche-generated charge carriers on account of the lower field strength prevailing in the auxiliary cell region 26, such that the function of the field plates 12 is also not impaired by avalanche-generated charge carriers on account of the connection via the interconnects 15 in the main cell region 25.

Figure 5:
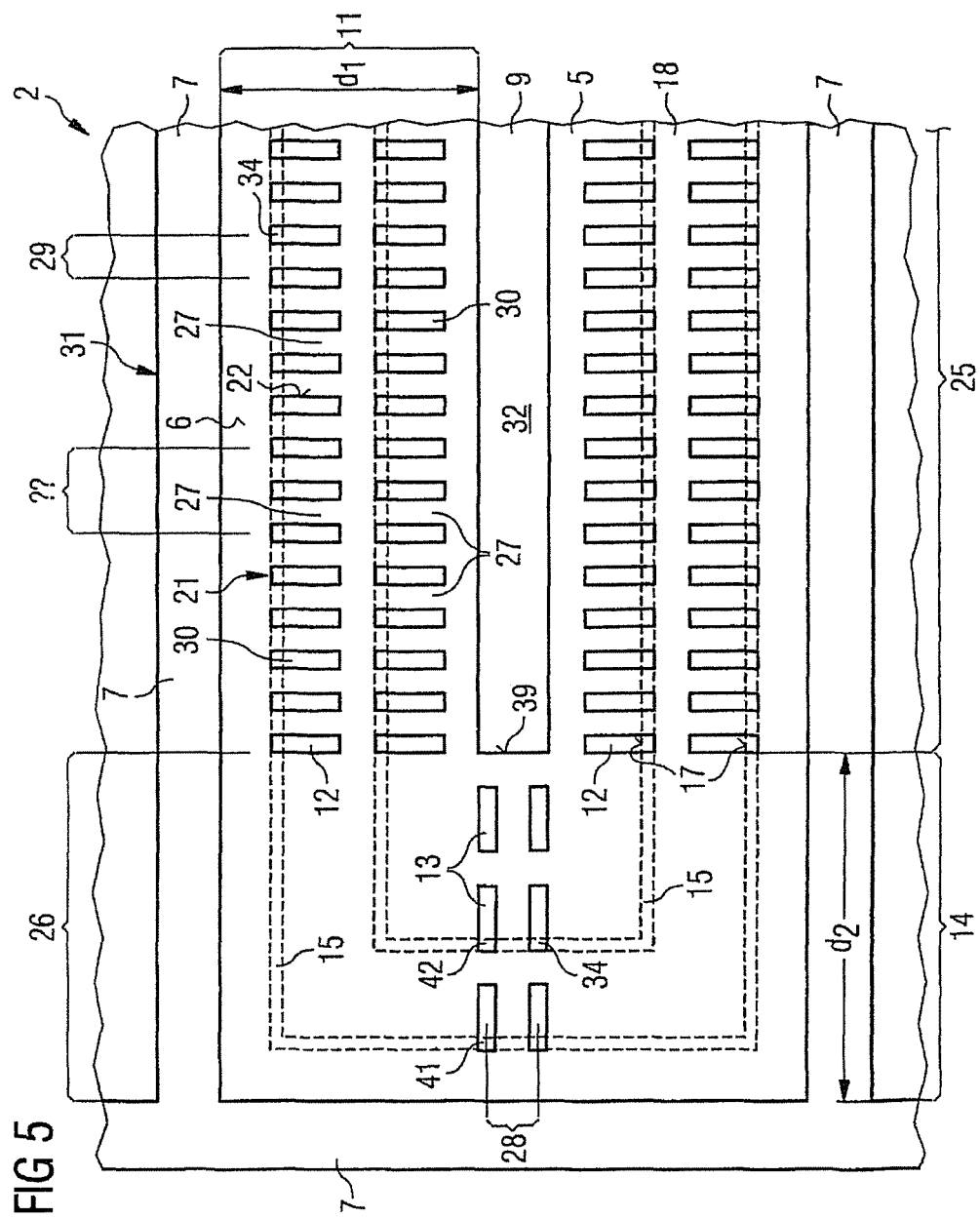
FIG. 5 illustrates a schematic plan view of a partial region of the semiconductor component in accordance with FIG. 4.

FIG. 5 illustrates a schematic plan view of a partial region of the semiconductor component 2 in accordance with FIG. 4. Components having the same functions as in FIG. 4 are identified by the same reference symbols and are not discussed separately. While the contours of electrodes 7 and 9 and also the field plates 12 and 13 are identified by solid lines, the interconnects 15 as coupling or connecting structures between the field plates 13 and 12 of the auxiliary cell regions 26 and the main cell regions 25, respectively, are identified by dashed lines. In this case, the field plates 12 and 13 are connected by their ends 17 via the interconnects 15, the ends 17 being oriented toward the first electrode 7.

FIG. 6 illustrates a schematic cross section through a semiconductor component 3 in accordance with a further embodiment of the invention. This semiconductor component 3 differs from the previous semiconductor components in that it has a vertical construction, wherein the first electrode 7 is arranged on the top side 6 of the semiconductor body and the second electrode 9 is arranged on the rear side of the semiconductor body. The first electrode 7 can be a source electrode S of a MOSFET structure or an emitter electrode E of an IGBT structure. Accordingly, the second electrode 9 arranged on the opposite rear side 16 is a drain electrode D of a MOSFET structure or a collector electrode K of an IGBT structure.

The control electrodes 36 are formed as gate electrodes G for both types of component and, when a control signal is applied, produce an n-conducting channel in the body zone 33, such that a current can flow through the drift path region 18. The shorter drift path length d1 in the main cell region 25 is achieved by virtue of the fact that a pedestal region 50 is applied on the highly doped substrate 44 in the main cell region 25, such that the drift path length d1 is shorter than the drift path length d2 in the auxiliary cell region 26. Accordingly, the trench width w1 for the field plates 12 in the main cell region 25 is smaller than the trench width w2 of the field plates 13 in the auxiliary cell region 26.

Such a pedestal 50 can be realized by an epitaxial layer firstly being applied to the highly doped substrate 44, which layer has the dopant concentration of the drift path region 18, and which, in the main cell region 25, is then highly doped by implantation or diffusion only for the main cell region 25. Afterwards, it is then possible to apply an epitaxial layer which has the dopant concentration of the drift path region throughout. The further production processes then correspond to the method sequences already presented for lateral semiconductor components 1 and 2.

In principle, it is possible to provide either the source electrode or the drain electrode on the rear side of a semiconductor component having a vertical drift path. If the drain electrode is positioned on the rear side, then this makes it necessary to construct the semiconductor component on an n-conducting substrate.

Whereas different drift path lengths were provided in the above embodiments and examples for the formation of the different field plates in the auxiliary cell region and in the main cell region, the same effect can be achieved if drift path lengths identical in length but with different structures or different parameters with regard to the drift zone or the field plates are provided. Thus, the drift zone can be doped more highly in the auxiliary cell region than in the region of the main cells, whereby it is possible to achieve the same effect as with a different drift zone length.

Moreover, despite an identical drift path length, the spacing of the field plates can be made larger in the region of the auxiliary cells than in the region of the main cells. Finally, it is also possible for the oxide thickness in the trench structures for the field plates to be structured differently in the auxiliary cell region and in the main cell region. Thus, the oxide in the trench structure can be formed in wedge-shaped fashion in the region of the auxiliary cells, for example, while it has a constant thickness in the region of the main cells. All these measures produce in principle the same protective effect as was described above for different drift zone lengths in the auxiliary cell region and main cell region.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
a semiconductor body having:
a first electrode electrically connected to a first zone of the semiconductor body; a second electrode electrically connected to a second zone of the semiconductor body, the first electrode being arranged on a top side of the semiconductor body and the second electrode being arranged on a rear side of the semiconductor body;
a drift path region arranged in the semiconductor body between the first electrode and the second electrode;
a cell region having:
a main cell region with main cells; and
an auxiliary cell region with at least one auxiliary cell;
wherein a first trench depth for a field plate in the main cell region is smaller than a second trench depth for a field plate in the auxiliary cell region, wherein the cell region includes a highly doped substrate, and wherein a pedestal region is disposed on the highly doped substrate, only in the main cell region.

2. The semiconductor component of claim 1, wherein the first trench comprises a first field plate and the second trench comprises a second field plate.

3. The semiconductor component of claim 1, further comprising field plates in the main cell region and field plates in the auxiliary cell region, wherein the field plates in the auxiliary cell region are longer than the field plates in the main cell region.

4. The semiconductor component of claim 2, wherein a distance between the second field plates is larger in the auxiliary cell region than a distance between the first field plates in the main cell region.

5. The semiconductor component of claim 2, wherein the first and second field plates project vertically into the semiconductor body in the drift path region, wherein the trench walls have an insulating layer and the trench structure is filled with an electrically conductive material or with a dielectric material.

6. The semiconductor component of claim 2, wherein the number of field plates is larger in the main cell region than in the auxiliary cell region.

7. The semiconductor component of claim 2, wherein the field plates, in the auxiliary cell region, are insulated from the surrounding drift path region by an insulating layer and, at a position between the first electrode and the second electrode, the field plates are electrically coupled to the drift path region and are at a drift path potential of the coupling position.

8. The semiconductor component of claim 1, wherein the first electrode is a source electrode of a MOSFET structure and the second electrode is a drain electrode of a MOSFET structure.

9. The semiconductor component of claim 1, wherein the first electrode is a drain electrode of a MOSFET structure and the second electrode is a source electrode of a MOSFET structure.

10. The semiconductor component of claim 1, wherein the first electrode is an emitter electrode of an IGBT structure and the second electrode is a collector electrode of an IGBT structure.

11. The semiconductor component of claim 1, wherein the auxiliary cell region has only body regions in contact with the source electrode.

12. The semiconductor component of claim 1, wherein an on resistivity, Ron×area A, of the at least one auxiliary cell is 10 to 30% higher than an on resistivity, Ron×area A, of the main cells.

13. The semiconductor component of claim 1, wherein a dopant concentration of the drift path is higher in the auxiliary cell region than in the main cell region.

14. The semiconductor component of claim 1, wherein the auxiliary cell region comprises a gate electrode.

15. The semiconductor component of claim 1, wherein the main cell region and the auxiliary cell region include respective a trench structures having trench walls, and wherein an oxide thickness profile along the trench walls of the trench structure in the main cell region differs from an oxide thickness profile of the trench walls of the trench structures of the field plates in the auxiliary cell region.

16. The semiconductor component of claim 1, wherein the breakdown voltage of the auxiliary cells is greater than the breakdown voltage of the main cells.

* * * * *